US010128854B2

(12) United States Patent
Shirotori et al.

(10) Patent No.: US 10,128,854 B2
(45) Date of Patent: Nov. 13, 2018

(54) OSCILLATION CIRCUIT, ELECTRONIC APPARATUS, AND MOVING OBJECT

(71) Applicant: Seiko Epson Corporation, Tokyo (JP)

(72) Inventors: Toru Shirotori, Minamiminowa (JP); Hisashi Yamaguchi, Fujimi (JP); Masaki Wakamori, Shiojiri (JP); Toshiya Usuda, Ina (JP); Sho Matsuzaki, Ina (JP); Tsuyoshi Yoneyama, Chino (JP); Masayuki Kamiyama, Chino (JP); Hiroshi Kiya, Suwa (JP)

(73) Assignee: Seiko Epson Corporation (JP)

( * ) Notice: Subject to any disclaimer, the term of this patent is extended or adjusted under 35 U.S.C. 154(b) by 135 days.

(21) Appl. No.: 15/245,774

(22) Filed: Aug. 24, 2016

(65) Prior Publication Data

US 2017/0063380 A1    Mar. 2, 2017

(30) Foreign Application Priority Data

Aug. 28, 2015   (JP) .................................. 2015-168816

(51) Int. Cl.
*H03L 1/04*        (2006.01)
*H03B 5/32*        (2006.01)
(Continued)

(52) U.S. Cl.
CPC ............ *H03L 1/04* (2013.01); *H03B 5/1234* (2013.01); *H03B 5/1265* (2013.01); *H03B 5/32* (2013.01); *H03L 1/026* (2013.01)

(58) Field of Classification Search
CPC .... H03L 1/02; H03L 1/04; H03B 5/32; H03B 5/1234; H03B 5/1265
(Continued)

(56) References Cited

U.S. PATENT DOCUMENTS 4,737,944 A    4/1988   Inoue et al.
7,371,005 B1*  5/2008   Ahuja ....................... G04F 5/06
                                                       331/176

(Continued)

FOREIGN PATENT DOCUMENTS

JP        58-041379 A    3/1983
JP        61-032604 A    2/1986
(Continued)

OTHER PUBLICATIONS

U.S. Appl. No. 15/245,670, filed Aug. 24, 2016, Toru Shirotori et al.

*Primary Examiner* — Arnold Kinkead
(74) *Attorney, Agent, or Firm* — Harness, Dickey & Pierce, P.L.C.

(57) ABSTRACT

An oscillation circuit includes an oscillating circuit adapted to oscillate a resonator element having a frequency-temperature characteristic, and a frequency adjustment circuit having a capacitance circuit connected to the oscillating circuit and adapted to adjust an oscillation frequency of the oscillating circuit, and a logic circuit, to which a signal having been output from the oscillating circuit is input, and which adjusts a frequency of the signal, and the frequency adjustment circuit compensates the frequency-temperature characteristic using at least the capacitance circuit in a predetermined temperature range, and compensates the frequency-temperature characteristic using the logic circuit alone outside the predetermined temperature range.

14 Claims, 8 Drawing Sheets

(51) Int. Cl.
*H03L 1/02* (2006.01)
*H03B 5/12* (2006.01)

(58) Field of Classification Search
USPC ............... 331/175, 158, 176, 177 V, 117 FE
See application file for complete search history.

(56) References Cited

U.S. PATENT DOCUMENTS

| | | |
|---|---|---|
| 2009/0115542 A1 | 5/2009 | Nakamura et al. |
| 2013/0285640 A1 | 10/2013 | Yamada et al. |
| 2014/0247095 A1* | 9/2014 | Edwards .................. H03L 1/02 331/176 |

FOREIGN PATENT DOCUMENTS

| | | |
|---|---|---|
| JP | 62-237388 A | 10/1987 |
| JP | 07-159553 A | 6/1995 |
| JP | 2002-228778 A | 8/2002 |
| JP | 2004-072289 A | 3/2004 |

\* cited by examiner

OSCILLATION CIRCUIT, ELECTRONIC APPARATUS, AND MOVING OBJECT

BACKGROUND

1. Technical Field

The present invention relates to an oscillation circuit, an electronic apparatus, and a moving object.

2. Related Art

In JP-A-58-41379 (Document 1), there is disclosed an electronic timepiece, which performs temperature compensation of the frequency of the quartz crystal oscillation circuit having the frequency-temperature characteristic shaped like a quadratic curve using a capacitance circuit and a frequency divider circuit for dividing the frequency of the output of the quartz crystal oscillation circuit.

In the electronic timepiece described in Document 1, if the temperature compensation is performed in the entire temperature range of the quadratic frequency-temperature characteristic provided to the quartz crystal resonator using the capacitance circuit and the frequency divider circuit, since the difference between the frequency at the peak of the quadratic curve and the frequency at the end temperature is large, it is necessary to enlarge the variable width of the capacitance value of the capacitance circuit. In such a case, since the capacitance value at the temperature corresponding to the peak becomes high, there is a problem that the power consumption in the oscillation circuit becomes high.

SUMMARY

An advantage of some aspects of the invention is to provide an oscillation circuit capable of reducing the power consumption. Another advantage of some aspects of the invention is to provide an electronic apparatus and a moving object using the oscillation circuit.

The invention can be implemented as the following aspects or application examples.

Application Example 1

An oscillation circuit according to this application example includes an oscillating circuit adapted to oscillate a resonator element having a frequency-temperature characteristic, and a frequency adjustment circuit having a capacitance circuit connected to the oscillating circuit and adapted to adjust an oscillation frequency of the oscillating circuit, and a logic circuit, to which a signal having been output from the oscillating circuit is input, and which adjusts a frequency of the signal, and the frequency adjustment circuit compensates the frequency-temperature characteristic using at least the capacitance circuit in a predetermined temperature range, and compensates the frequency-temperature characteristic using the logic circuit alone outside the predetermined temperature range.

The circuit including the oscillating circuit and the resonator element can also be a variety of types of oscillation circuit such as a pierce oscillator circuit, an inverter type oscillation circuit, a Colpitts oscillator circuit, or a Hartley oscillator circuit.

According to the oscillation circuit related to this application example, since the frequency-temperature characteristic of the resonator element is compensated using the logic circuit alone outside the predetermined temperature range, the width of the predetermined temperature range in which the frequency-temperature characteristic of the resonator element is compensated using the capacitance circuit can be narrowed. Therefore, since the variable capacitance width necessary for the capacitance circuit is narrowed and thus the maximum capacitance value of the capacitance circuit can be decreased, the power consumption can be reduced.

Application Example 2

In the oscillation circuit according to the application example described above, the frequency adjustment circuit may compensate the frequency-temperature characteristic using both of the capacitance circuit and the logic circuit in the predetermined temperature range.

According to the oscillation circuit related to this application example, since the frequency-temperature characteristic of the resonator element remaining uncompensated using the capacitance circuit can further be compensated by the logic circuit in the predetermined temperature range, the frequency accuracy can be improved.

Application Example 3

In the oscillation circuit according to the application example described above, the frequency-temperature characteristic may have a characteristic of a quadratic function with respect to the temperature, and the predetermined temperature range includes a temperature corresponding to a peak of the quadratic function.

According to the oscillation circuit related to this application example, since the closer to the peak of the quadratic function, the temperature is, the smaller the frequency variation per unit temperature is, the maximum value of the frequency difference of the resonator element in the predetermined temperature range can be made smaller in the case in which the predetermined temperature range includes the temperature corresponding to the peak of the quadratic function than in other cases. Therefore, since the variable capacitance width of the capacitance circuit can be narrowed, the power consumption can be reduced.

Application Example 4

In the oscillation circuit according to the application example described above, the predetermined temperature range may be adjustable.

According to the oscillation circuit related to this application example, it is possible to adjust the temperature range in which the frequency-temperature characteristic of the resonator element is compensated using the capacitance circuit and the temperature range in which the frequency-temperature characteristic of the resonator element is compensated using the logic circuit alone depending on the intended use. For example, by narrowing the temperature range in which the compensation is performed using the capacitance circuit (enlarging the temperature range in which the compensation is performed using the logic circuit alone), it is possible to reduce the power consumption, and by enlarging the temperature range in which the compensation is performed using the capacitance circuit (narrowing the temperature range in which the compensation is performed using the logic circuit alone), it is possible to ensure the high frequency accuracy in a broader temperature range.

Application Example 5

In the oscillation circuit according to the application example described above, the frequency adjustment circuit may correct a frequency variation other than the frequency-temperature characteristic using the logic circuit.

According to the oscillation circuit related to this application example, since the frequency variation not caused by the frequency-temperature characteristic of the resonator element is also corrected, the frequency accuracy can further be improved.

Application Example 6

In the oscillation circuit according to the application example described above, the frequency variation other than the frequency-temperature characteristic may be a temporal frequency variation of the resonator element.

According to the oscillation circuit related to this application example, since the temporal frequency variation of the resonator element is also corrected, the frequency accuracy can be maintained for a long period of time.

Application Example 7

An electronic apparatus according to this application example includes any one of the oscillation circuits described above.

Application Example 8

A moving object according to the present application example includes any one of the oscillation circuits described above.

According to these application examples, since there is used the oscillation circuit capable of reducing the power consumption, it is also possible to realize, for example, the electronic apparatus and the moving object low in power consumption and high in reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some preferred embodiments of the invention will be described in detail using the accompanying drawings. It should be noted that the embodiments described below do not unreasonably limit the content of the invention as set forth in the appended claims. Further, all of the constituents described below are not necessarily essential elements of the invention.

1. Real-Time Clock Device 1-1. First Embodiment

Figure 1:
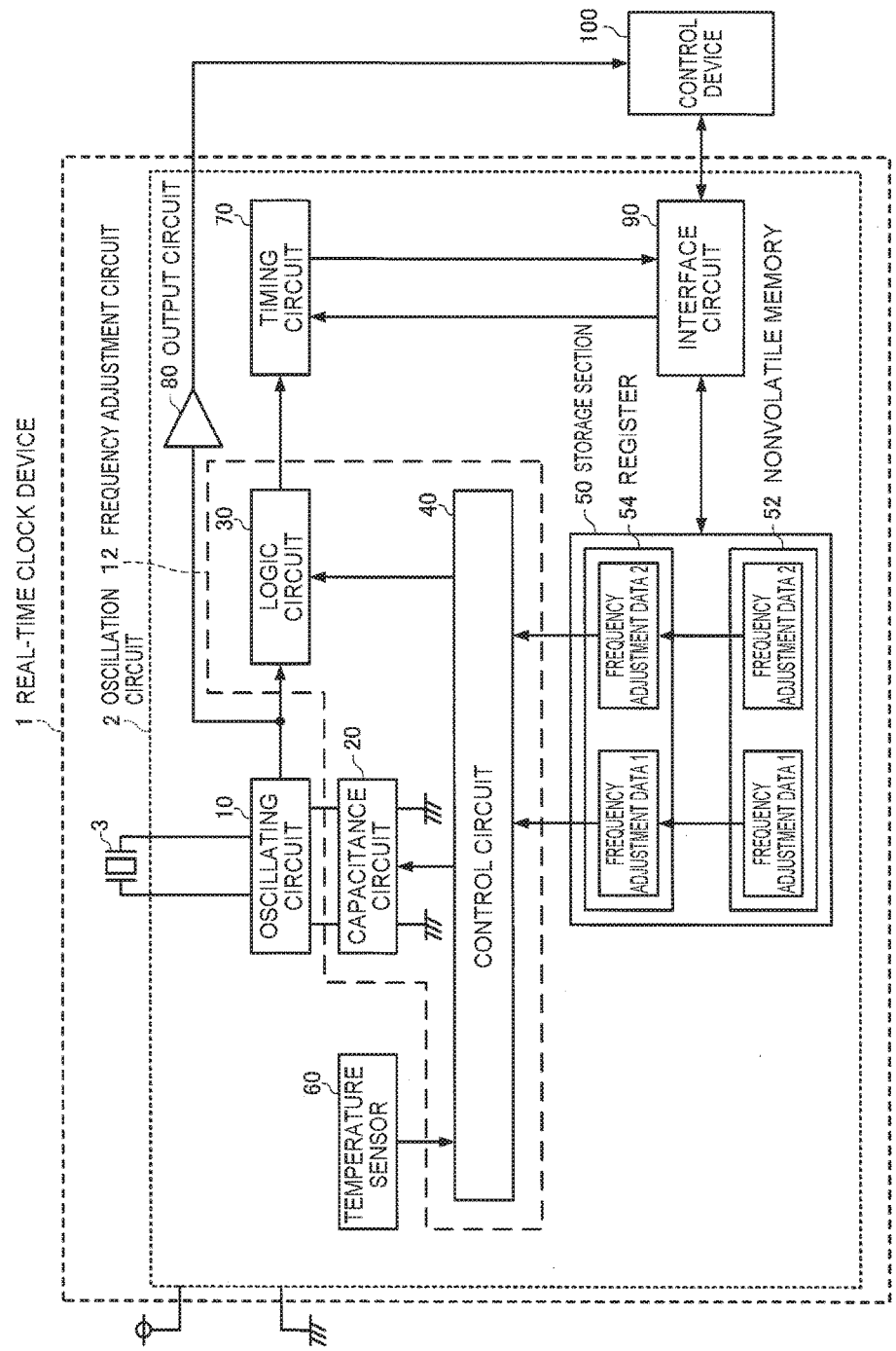
FIG. 1 is a functional block diagram of a real-time clock device according to a first embodiment of the invention.

FIG. 1 is a functional block diagram of a real-time clock device according to the first embodiment. As shown in FIG. 1, the real-time clock device 1 according to the first embodiment is an oscillator including an oscillation circuit 2 and a resonator element 3. In the present embodiment, the real-time clock device 1 is connected to a control device 100.

The resonator element 3 is connected to a package (not shown) via a bonding member such as an electrically conductive or non-electrically conductive adhesive or a bump made of metal, resin, or the like, and is encapsulated in the package in a state of having high airtightness to thereby constitute a resonator, and the oscillation circuit 2 and the resonator (the package airtightly encapsulating the resonator element 3) are housed in a package not shown. Further, the resonator element 3 has excitation electrodes electrically connected to an oscillating circuit 10 described later to oscillate the resonator element 3.

As the resonator element 3, there can be used, for example, a surface acoustic wave (SAW) resonator, an AT-cut crystal resonator element, an SC-cut crystal resonator element, a tuning-fork crystal resonator element, other piezoelectric resonator elements, and a Micro Electro Mechanical Systems (MEMS) resonator element. As a substrate material of the resonator element 3, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the resonator element 3, there can be used a device using a piezoelectric effect, or electrostatic drive using a coulomb force.

The oscillation circuit 2 is configured including the oscillating circuit 10, a frequency adjustment circuit 12, a storage circuit 50, a temperature sensor 60, a timing circuit 70, an output circuit 80, and an interface circuit 90, and operates using a voltage applied between a power supply terminal and an earth terminal (a ground terminal) as a power supply voltage. It should be noted that the oscillation circuit 2 according to the present embodiment can have a configuration obtained by eliminating or modifying some of these constituents, or adding other constituents.

The oscillation circuit 2 can be configured as a single integrated circuit (IC), or can also be constituted by a plurality of integrated circuits (IC). Further, the oscillation circuit 2 can have some of the constituents not integrated, but discretely configured using a plurality of electronic components, for example.

The oscillating circuit 10 is a circuit for oscillating the resonator element 3, and amplifies the output signal of the resonator element 3 and feeds the output signal thus amplified back to the resonator element 3. The oscillating circuit 10 uses the capacitance of a capacitance circuit 20 as the load capacitance, and oscillates the resonator element 3 at a frequency corresponding to the value of the load capacitance.

The frequency adjustment circuit 12 includes the capacitance circuit 20, a logic circuit 30, and a control circuit 40.

The capacitance circuit 20 is a circuit, which is connected to the oscillating circuit 10, and has a capacitance value varying in accordance with a control signal from the control circuit 40. For example, the capacitance circuit 20 can include a variable capacitance element (e.g., a varactor) having a capacitance value varying in accordance with the control signal (a control voltage) from the control circuit 40 applied to a terminal of the variable capacitance element. Further, for example, the capacitance circuit 20 can include a capacitance bank circuit, which includes a plurality of capacitive elements and a plurality of switches, and in which each of the switches operates in accordance with the control signal from the control circuit 40, the capacitive elements to be connected to the oscillating circuit 10 are selected in accordance with the operation of the switches, and thus the value of the load capacitance is changed.

As described above, the capacitance circuit 20 is a circuit, which is connected to the oscillating circuit 10 to be controlled in operation by the control circuit 40, and thus adjusts the oscillation frequency (the oscillation frequency of the resonator element 3) of the oscillating circuit 10.

The temperature sensor 60 is a thermosensor for outputting a signal (e.g., a voltage corresponding to the temperature) corresponding to the ambient temperature of the temperature sensor 60. The temperature sensor 60 can be a positive type, in which the higher the temperature is, the higher the output voltage is, or can also be a negative type, in which the higher the temperature is, the lower the output voltage is. It should be noted that a device, the output voltage of which varies as linearly as possible with respect to the change in temperature in a desired temperature range in which the operation of the real-time clock device 1 is guaranteed is desirable as the temperature sensor 60. The temperature sensor 60 can also be, for example, a temperature detection circuit using a bandgap of a semiconductor, a thermistor (e.g., a negative temperature coefficient (NTC) thermistor, or a positive temperature coefficient (PTC) thermistor), or a platinum resistor.

A signal output from the oscillating circuit 10 is input to the logic circuit 30, and the logic circuit 30 divides the signal thus input at a division ratio corresponding to the control signal from the control circuit 40, and then outputs the result. For example, the logic circuit 30 can include a frequency divider circuit, which uses the output signal of the oscillating circuit 10 as a clock signal, and the division ratio of which varies in accordance with the control signal from the control circuit 40. Further, for example, the logic circuit 30 can also include a frequency divider circuit with a fixed division ratio, and a circuit, which thins some of the clock pulses from the output signal of the oscillating circuit 10 in accordance with the control signal from the control circuit 40, or adds some clock pulses to the output signal of the oscillating circuit 10, to supply the result as a clock signal of the frequency divider circuit.

As described above, the logic circuit 30 is a circuit for adjusting the frequency of the signal, which has been output from the oscillating circuit 10 and then input to the logic circuit 30, due to the operation controlled by the control circuit 40. Then, the logic circuit 30 generates a clock signal having a period of, for example, 1 second, and then outputs the clock signal to the timing circuit 70.

The control circuit 40 controls the operation of the capacitance circuit 20 and the operation of the logic circuit 30.

In the present embodiment, the control circuit 40 controls the capacitance value (the load capacitance value of the oscillating circuit 10) of the capacitance circuit 20 based on the output signal of the temperature sensor 60 and frequency adjustment data 1 stored in the storage section 50 (the register 54). Specifically, the control circuit 40 generates a control signal, with which the capacitance value (the load capacitance value of the oscillating circuit 10) of the capacitance circuit 20 becomes the capacitance value for correcting (compensating) the frequency-temperature characteristic of the resonator element 3, in accordance with the frequency adjustment data 1, and then outputs the control signal to the capacitance circuit 20 if the temperature corresponding to the output signal of the temperature sensor 60 is in a predetermined temperature range. Due to the control signal, there is performed the control of decreasing the frequency deviation of the output signal of the oscillating circuit 10 in a predetermined temperature range. In order for the correction of the frequency-temperature characteristic of the resonator element 3 by the capacitance circuit 20 to be performed more correctly, it is desirable for the temperature sensor 60 to be disposed at a place (e.g., a place close to the resonator element 3) where the temperature of the resonator element 3 can more accurately be detected. It should be noted that the temperature sensor 60 can also be disposed at a place (e.g., a place close to the oscillating circuit 10, or a place close to the oscillation circuit 2) where the temperature change caused by the operation of the oscillating circuit 10 or the oscillation circuit 2 including the oscillating circuit 10 can be detected.

Further, the control circuit 40 controls the division ratio of the logic circuit 30 based on the output signal of the temperature sensor 60 and frequency adjustment data 2 stored in the storage section 50 (the register 54). Specifically, the control circuit 40 generates a control signal (a correction signal) for the logic circuit 30 to correct (compensate) the frequency-temperature characteristic of the resonator element 3 in accordance with the frequency adjustment data 2, and then outputs the control signal to the logic circuit 30 if the temperature corresponding to the output signal of the temperature sensor 60 is outside the predetermined temperature range. Due to the control signal, there is performed the control of decreasing the frequency deviation of the output signal of the logic circuit 30 outside the predetermined temperature range.

As described above, in the present embodiment, the frequency adjustment circuit 12 compensates the frequency-temperature characteristic of the resonator element in the predetermined temperature range using only the capacitance circuit 20, and compensates the frequency-temperature characteristic of the resonator element 3 outside the predetermined temperature range using only the logic circuit 30 due to the control by the control circuit 40.

The signal output by the oscillating circuit 10 is input to the output circuit 80, and the output circuit 80 generates an oscillation signal for an external output, and is then output the oscillation signal to the outside via an external terminal of the oscillating circuit 10. It is also possible for the output circuit 80 to divide the frequency of the signal output by the oscillating circuit 10 to thereby generate the oscillation signal for the external output. It is possible for the control device 100 to operate using the oscillation signal as the clock signal.

The storage section 50 is configured including a nonvolatile memory 52 and the register 54. The nonvolatile memory 52 is a storage section for storing a variety of data for the control by the control circuit 40, and can be a variety of types of rewritable nonvolatile memory such as an electrically erasable programmable read-only memory (EEPROM) and a flash memory, or can also be a variety of types of non-rewritable nonvolatile memory such as a one-time programmable read-only memory (one-time PROM).

In the present embodiment, the nonvolatile memory 52 stores the frequency adjustment data 1 as the data for controlling the capacitance value (the load capacitance value of the oscillating circuit 10) of the capacitance circuit 20. The frequency adjustment data 1 is the data for the correction of the frequency-temperature characteristic of the resonator element 3 by the capacitance circuit 20, and can also be zero-order, first-order, and second-order coefficient values (third or higher order coefficient values can also be included) corresponding to the frequency-temperature characteristic of the resonator element 3 in the predetermined temperature range if, for example, the frequency-temperature characteristic of the resonator element 3 has a quadratic characteristic with respect to the temperature. Alternatively, the frequency adjustment data 1 can also be correspondence information between the output voltage of the temperature sensor 60 and the capacitance value of the capacitance circuit 20 determined in accordance with the frequency-temperature characteristic of the resonator element 3 in the predetermined temperature range.

Further, the nonvolatile memory 52 stores the frequency adjustment data 2 as the data for controlling the division ratio of the logic circuit 30. The frequency adjustment data 2 is the data for the correction of the frequency-temperature characteristic of the resonator element 3 by the logic circuit 30, and can also be, for example, the correspondence information between the output voltage of the temperature sensor 60 and the division ratio of the logic circuit 30 determined in accordance with the frequency-temperature characteristic (or the frequency-temperature characteristic of the output signal of the oscillating circuit 10) of the resonator element 3 outside the predetermined temperature range.

Each of the data (the frequency adjustment data 1, and the frequency adjustment data 2) stored in the nonvolatile memory 52 are transferred from the nonvolatile memory 52 to the register 54, when powering on (when the voltage between the power terminal and the earth terminal (the ground terminal) rises from 0 V to an operable voltage) the real-time clock device 1 (the oscillation circuit 2), and are then held in the register 54.

In the present embodiment, the oscillation circuit 2 is configured so that reading/writing can be performed on the storage section 50 (the nonvolatile memory 52 and the register 54) via the interface circuit 90. The interface circuit 90 can be an interface circuit compatible with a variety of types of serial bus such as SPI (Serial Peripheral Interface) or I²C (Inter-Integrated Circuit), or can also be an interface circuit compatible with a parallel bus.

The real-time clock device 1 is set at each of temperatures in the predetermined temperature range by the inspection device not shown in, for example, the manufacturing process (the inspection process) of the real-time clock device 1, and the frequency adjustment data 1 is determined based on the frequency of the oscillation signal output from the output circuit 80 at each of the temperatures, and is then written into the nonvolatile memory 52.

Further, the real-time clock device 1 is set at each of temperatures outside the predetermined temperature range in, for example, the manufacturing process (the inspection process) of the real-time clock device 1, and the frequency adjustment data 2 is determined based on the frequency of the oscillation signal output from the output circuit 80 at each of the temperatures, and is then written into the nonvolatile memory 52.

Figure 2:
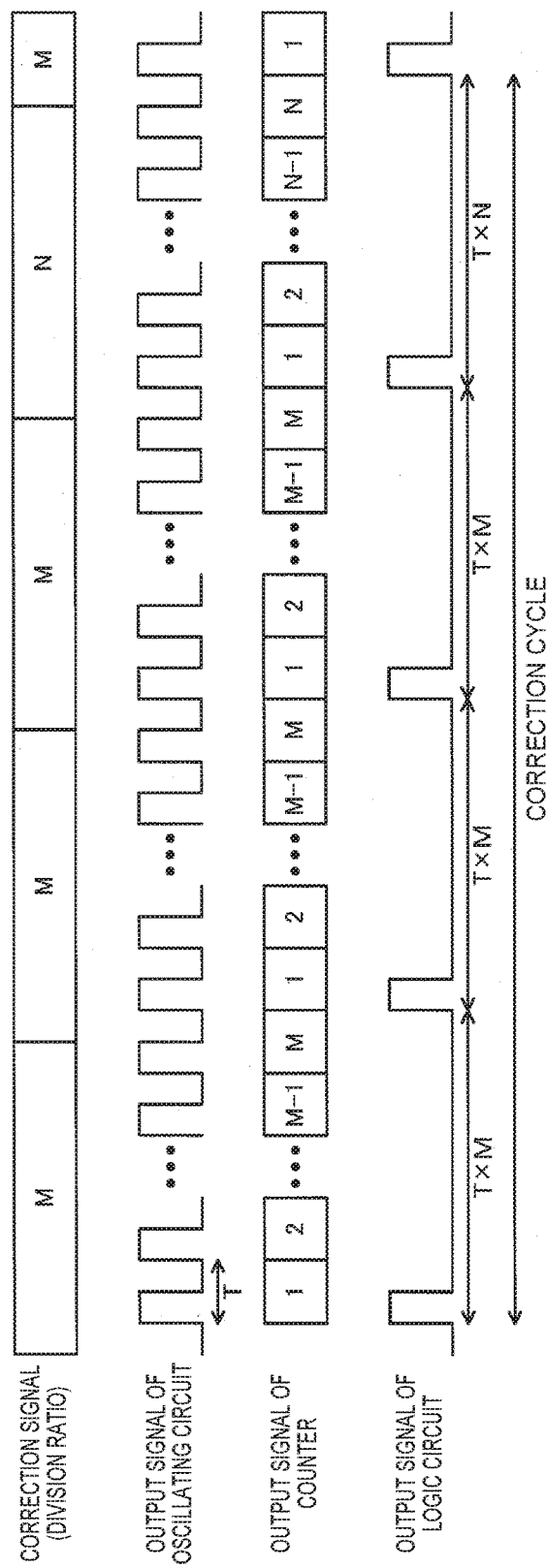
FIG. 2 is a timing chart showing an example of frequency correction using a logic circuit.

FIG. 2 is a timing chart showing an example of the correction using the logic circuit 30. In the example shown in FIG. 2, the control circuit 40 outputs the correction signal for setting the division ratio to M in three periods and setting the division ratio to N in one period during four periods of the output signal of the logic circuit 30 based on the output signal of the temperature sensor 60 and the frequency adjustment data 2. Then, the logic circuit 30 counts the division ratio of the correction signal with a counter (not shown in FIG. 1), and generates a pulse in the output signal every time the count value coincides with the division ratio.

Since the division ratio is always M in the case in which the correction by the logic circuit 30 is not performed, by the correction being performed by the logic circuit 30, the average value of the period of the output signal of the logic circuit 30 is corrected to $\{(3M+N)/4M\}$ times. As a result of such a correction by the logic circuit 30, it is possible to make the average value of the period of the output signal of the logic circuit 30 coincide with a predetermined time (e.g., 1 second). The control circuit 40 sets N so as to approximate the oscillation frequency (the oscillation frequency of the resonator element 3) of the oscillating circuit 10 to a desired frequency based on the output signal of the temperature sensor 60 and the frequency adjustment data 2.

The timing circuit 70 generates clock time information (information of year, month, day, hour, minute, second, and so on) based on the signal (e.g., a clock signal with the period of 1 second) output by the logic circuit 30. The clock time information is assigned to a predetermined address of the register 54, and it is possible for the control device 100 to access the address of the register 54 via the interface circuit 90 to retrieve the clock time information. It should be noted that the clock time information generated by the timing circuit 70 can be corrected or generated based on, for example, the reference clock time information input from the control device 100 to the interface circuit 90.

Further, it is also possible for the timing circuit 70 to have an alarm function, and to output a signal (e.g., an interrupt signal) representing the fact that the time preset to the register 54 from the control device 100 via the interface circuit 90 has been reached. The control device 100 can receive the signal to perform a predetermined process.

Further, it is also possible for the timing circuit 70 to have a timer function, and to measure the time having been preset to the register 54 from the control device 100 via the interface circuit 90 to output a signal (e.g., an interrupt signal) representing the fact that the measurement has been completed. The control device 100 can receive the signal to perform a predetermined process.

It should be noted that although in the example shown in FIG. 2, the cycle length (correction cycle) of the correction by the logic circuit 30 corresponds to four periods of the output signal of the logic circuit 30, the longer the correction cycle is, the higher the correction accuracy (resolution) becomes. It should be noted that if the correction cycle is elongated, the correction amount also increases, and therefore, there occurs a state in which one of the periods of the output signal of the logic circuit 30 alone is extremely long or short in each of the correction cycles, and there is a possibility that the operation of the timing circuit 70 becomes unallowable. Therefore, in general, it is desirable to make the correction cycle as short as possible within a range in which the necessary frequency accuracy is satisfied.

Figure 3:
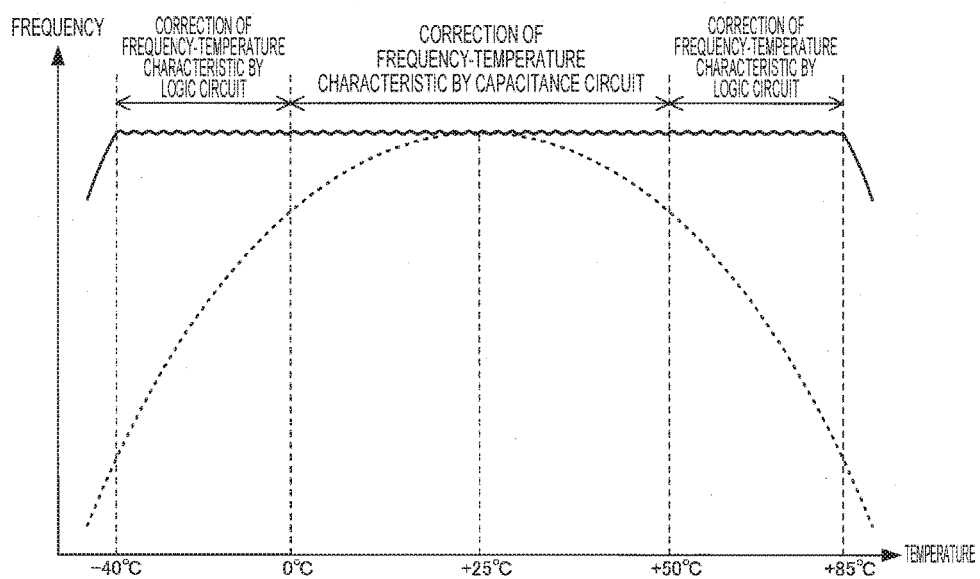
FIG. 3 is a diagram showing an example of a frequency correction method and a frequency-temperature characteristic of an output signal of the logic circuit in the first embodiment.

In the real-time clock device 1 (the oscillation circuit 2) according to the first embodiment described hereinabove, if the frequency adjustment circuit 12 does not correct the frequency-temperature characteristic of the resonator element 3 with the capacitance circuit 20 and the logic circuit 30 in the entire temperature range, the frequency-temperature characteristic of the output signal of the logic circuit 30 becomes the curve corresponding to the frequency-temperature characteristic of the resonator element 3 as indicated by the dotted line in FIG. 3.

In reality, due to the control by the control circuit 40, the frequency adjustment circuit 12 compensates the frequency-temperature characteristic of the resonator element 3 using only the capacitance circuit 20 in the predetermined temperature range (e.g., not lower than 0° C. and not higher than +50° C.), and compensates the frequency-temperature characteristic of the resonator element 3 using only the logic circuit 30 outside the predetermined temperature range (e.g., not lower than −40° C. and lower than 0° C. or higher than +50° C. and not higher than +85° C.) in the entire temperature range (e.g., not lower than −40° C. and not higher than +85° C.) as the temperature range in which the operation of the oscillation circuit 2 is guaranteed. Therefore, as indicated by the solid line in FIG. 3, the frequency of the output signal of the logic circuit 30 is corrected so as to approximate to the desired frequency (e.g., 1 Hz) irrespective of the temperature in the entire temperature range (e.g., not lower than −40° C. and not higher than +85° C.)

In the present embodiment, if the frequency adjustment circuit 12 corrects the frequency-temperature characteristic of the resonator element 3 using the capacitance circuit 20 in the entire temperature range (not lower than −40° C. and not higher than +85° C. in FIG. 3) similarly to the related art, since the difference between the reference temperature (+25° C.) and the temperature (+85° C.) at the end of the entire temperature range is large, in order to set the capacitance value of the capacitance circuit 20 to, for example, 3 pF at +85° C., it is necessary to set the capacitance value to 13 pF at +25° C. In the present embodiment, since the frequency adjustment circuit 12 corrects the frequency-temperature characteristic of the resonator element 3 using the capacitance circuit 20 only in the predetermined temperature range (not lower than 0° C. and not higher than +50° C. in FIG. 3) as a part of the entire temperature range, in order to set the capacitance value of the capacitance circuit 20 to, for example, 3 pF at the +50° C., it is sufficient to set the capacitance value to 8 pF at +25° C. Therefore, in the present embodiment, since the current consumption caused by charging or discharging the capacitor of the capacitance circuit 20 in the oscillation of the oscillating circuit 10 becomes smaller than in the related art, the power consumption can be reduced.

Further, if the frequency-temperature characteristic of the resonator element 3 has a quadratic function characteristic with respect to the temperature, it is preferable for the predetermined temperature range to include the temperature corresponding to the peak of the quadratic function. Since the closer to the peak of the quadratic function the temperature is, the smaller the frequency variation per unit temperature is, it is possible to decrease the frequency differences between the temperatures (0° C. and +50° C. in FIG. 3) at the ends of the predetermined temperature range (not lower than 0° C. and not higher than +50° C. in FIG. 3) and the temperature (+25° C. in FIG. 3) at the peak of the quadratic function. In this case, since it is possible to decrease the difference between the capacitance value of the capacitance circuit 20 at the temperature corresponding to the peak of the quadratic function and the capacitance value of the capacitance circuit 20 at the temperature corresponding to each of the ends of the predetermined temperature range, it is possible to make the circuit area of the capacitance circuit 20 smaller than ever, and at the same time reduce the current consumption caused by charging or discharging the capacitor of the capacitance circuit 20.

1-2. Second Embodiment

The functional block diagram of the real-time clock device according to the second embodiment is substantially the same as FIG. 1, and therefore the illustration of the functional block is omitted. Hereinafter, the second embodiment will be described with a focus on the contents in which the second embodiment is different from the first embodiment, and the description redundant to the first embodiment will be omitted.

In the second embodiment, similarly to the first embodiment, the control circuit 40 generates a control signal, with which the capacitance value (the load capacitance value of the oscillating circuit 10) of the capacitance circuit 20 becomes the capacitance value for correcting (compensating) the frequency-temperature characteristic of the resonator element 3, in accordance with the frequency adjustment data 1, and then outputs the control signal to the capacitance circuit 20 if the temperature corresponding to the output signal of the temperature sensor 60 is in the predetermined temperature range. Due to the control signal, there is performed the control of decreasing the frequency deviation of the output signal of the oscillating circuit 10 in a predetermined temperature range.

Further, the control circuit 40 controls the division ratio of the logic circuit 30 based on the output signal of the temperature sensor 60 and frequency adjustment data 2. Specifically, the control circuit 40 generates the control signal (the correction signal) for the logic circuit to correct (compensate) the frequency-temperature characteristic of the resonator element 3 in accordance with the output signal of the temperature sensor 60 and the frequency adjustment data 2, and outputs the control signal to the logic circuit 30. Due to the control signal, there is performed the control of decreasing the frequency deviation of the output signal of the logic circuit 30 outside the predetermined temperature range, and at the same time, there is performed the control of further decreasing the frequency deviation of the output signal of the logic circuit 30 in the predetermined temperature range.

The frequency adjustment data 2 is the data for the correction of the frequency-temperature characteristic of the resonator element 3 by the logic circuit 30, and includes, for example, the correspondence information between the output voltage of the temperature sensor 60 and the division ratio of the logic circuit 30 determined in accordance with the frequency-temperature characteristic (or the frequency-temperature characteristic of the output signal of the oscillating circuit 10) of the resonator element 3 outside the predetermined temperature range. Further, the frequency adjustment data 2 includes the correspondence information between the output voltage of the temperature sensor 60 and the division ratio of the logic circuit 30 determined in accordance with the frequency-temperature characteristic of the output signal of the oscillating circuit 10 in the predetermined temperature range.

As described above, in the second embodiment, the frequency adjustment circuit 12 compensates the frequency-temperature characteristic of the resonator element 3 in the predetermined temperature range using both of the capacitance circuit 20 and the logic circuit 30, and compensates the frequency-temperature characteristic of the resonator element 3 outside the predetermined temperature range using only the logic circuit 30 due to the control by the control circuit 40.

The real-time clock device 1 is set at each of the temperatures by the inspection device not shown in, for example, the manufacturing process (the inspection process) of the real-time clock device 1, and the frequency adjustment data 2 is determined based on the frequency of the oscillation signal output from the output circuit 80 at each of the temperatures in the state in which the capacitance value of the capacitance circuit 20 is controlled based on the frequency adjustment data 1 having been determined in advance, and is then written into the nonvolatile memory 52.

Similarly to the first embodiment, the data (the frequency adjustment data 1, and the frequency adjustment data 2) stored in the nonvolatile memory 52 are transferred from the nonvolatile memory 52 to the register 54 when powering on the real-time clock device 1 (the oscillation circuit 2), and are then held in the register 54.

The rest of the configuration and the function of the real-time clock device 1 (the oscillation circuit 2) according to the second embodiment are substantially the same as those of the first embodiment.

Figure 4:
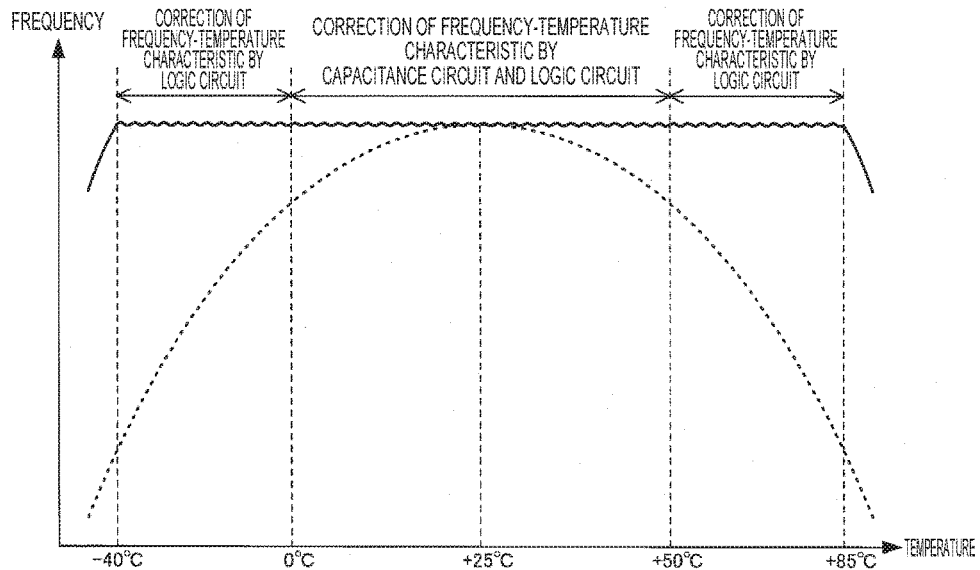
FIG. 4 is a diagram showing an example of a frequency correction method and a frequency-temperature characteristic of an output signal of a logic circuit in a second embodiment of the invention.

In the real-time clock device 1 (the oscillation circuit 2) according to the second embodiment described hereinabove, if the frequency adjustment circuit 12 does not correct the frequency-temperature characteristic of the resonator element 3 with the capacitance circuit 20 and the logic circuit 30 in the entire temperature range, the frequency-temperature characteristic of the output signal of the logic circuit 30 becomes the curve corresponding to the frequency-temperature characteristic of the resonator element 3 as indicated by the dotted line in FIG. 4.

In reality, due to the control by the control circuit 40, the frequency adjustment circuit 12 compensates the frequency-temperature characteristic of the resonator element 3 using both of the capacitance circuit 20 and the logic circuit 30 in the predetermined temperature range (e.g., not lower than 0° C. and not higher than +50° C.), and compensates the frequency-temperature characteristic of the resonator element 3 using only the logic circuit 30 outside the predetermined temperature range (e.g., not lower than −40° C. and lower than 0° C. or higher than +50° C. and not higher than +85° C.) in the entire temperature range (e.g., not lower than −40° C. and not higher than +85° C.) as the temperature range in which the operation of the oscillation circuit 2 is guaranteed. Therefore, as indicated by the solid line in FIG. 4, the frequency of the output signal of the logic circuit 30 is corrected so as to approximate to the desired frequency (e.g., 1 Hz) irrespective of the temperature in the entire temperature range (e.g., not lower than −40° C. and not higher than +85° C.). In particular, in the predetermined temperature range (e.g., not lower than 0° C. and not higher than +50° C.), since the frequency adjustment circuit 12 further compensates the frequency-temperature characteristic of the resonator element 3, which remains uncompensated using the capacitance circuit 20, using the logic circuit 30, the compensation can be achieved with higher accuracy than in the first embodiment.

1-3. Third Embodiment

Figure 5:
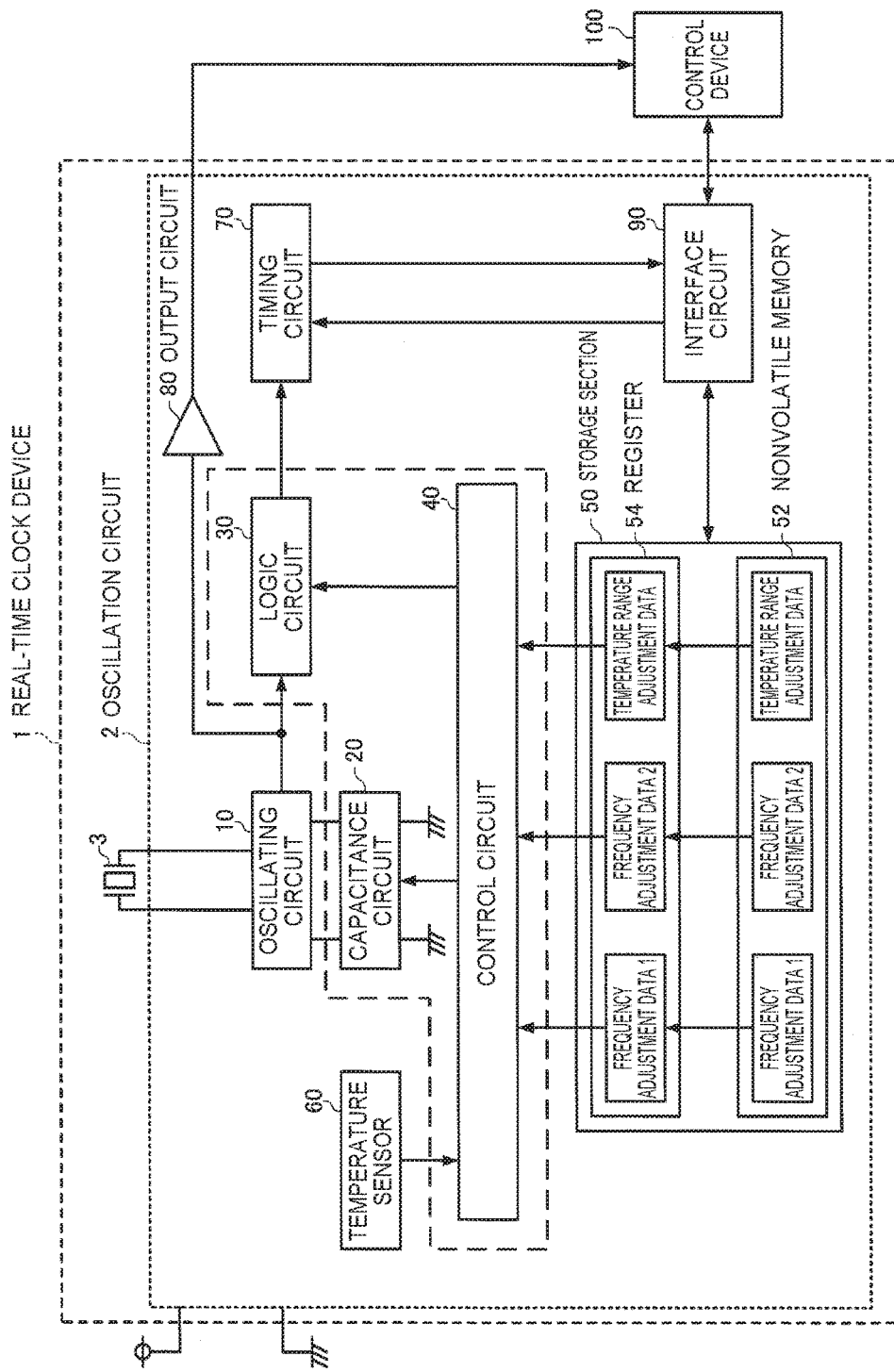
FIG. 5 is a functional block diagram of a real-time clock device according to a third embodiment of the invention.

FIG. 5 is a functional block diagram of a real-time clock device according to a third embodiment. In FIG. 5, the constituents substantially the same as those in FIG. 1 are denoted by the same reference symbols, and the third embodiment will hereinafter be described with a focus on different contents from the first embodiment and the second embodiment, and the description redundant to the first embodiment or the second embodiment will be omitted.

In the third embodiment, similarly to the first embodiment and the second embodiment, the control circuit 40 generates a control signal, with which the capacitance value (the load capacitance value of the oscillating circuit 10) of the capacitance circuit 20 becomes the capacitance value for correcting (compensating) the frequency-temperature characteristic of the resonator element 3, in accordance with the frequency adjustment data 1, and then outputs the control signal to the capacitance circuit 20 if the temperature corresponding to the output signal of the temperature sensor 60 is in the predetermined temperature range.

Further, the control circuit 40 controls the division ratio of the logic circuit 30 based on the frequency adjustment data 2 similarly to the first embodiment, or controls the division ratio of the logic circuit 30 based on the output signal of the temperature sensor 60 and the frequency adjustment data 2 similarly to the second embodiment.

Further, the control circuit 40 controls the predetermined temperature range based on temperature range adjustment data stored in the storage section 50 (the register 54).

As described above, in the third embodiment, the frequency adjustment circuit 12 compensates the frequency-temperature characteristic of the resonator element 3 in the predetermined temperature range using the capacitance circuit 20 (or using both of the capacitance circuit 20 and the logic circuit 30), and compensates the frequency-temperature characteristic of the resonator element 3 outside the predetermined temperature range using only the logic circuit 30 due to the control by the control circuit 40, and the predetermined temperature range can be adjusted.

As shown in FIG. 5, in the third embodiment, the nonvolatile memory 52 stores the frequency adjustment data 1 and the frequency adjustment data 2 similarly to the first embodiment or the second embodiment.

Further, in the third embodiment, the nonvolatile memory 52 stores the temperature range adjustment data. The temperature range adjustment data is the data for controlling the predetermined temperature range described above. The temperature range adjustment data can also be, for example, the data representing a partial temperature range (e.g., not lower than 0° C. and not higher than +50° C.) included in the entire temperature range (e.g., not lower than −40° C. and not higher than +85° C.) as the temperature range in which the operation of the oscillation circuit 2 is guaranteed.

The temperature range adjustment data is determined in accordance with, for example, the specification or the intended use of the real-time clock device 1, and is written to the nonvolatile memory 52 by an inspection device not shown in the manufacturing process (the inspection process) of the real-time clock device 1.

Similarly to the first embodiment or the second embodiment, the data (the frequency adjustment data 1, the frequency adjustment data 2, and the temperature range adjustment data) stored in the nonvolatile memory 52 are transferred from the nonvolatile memory 52 to the register 54 when powering on the real-time clock device 1 (the oscillation circuit 2), and are then held in the register 54.

The rest of the configuration and the function of the real-time clock device 1 (the oscillation circuit 2) according to the third embodiment are substantially the same as those of the first embodiment or the second embodiment.

The real-time clock device 1 (the oscillation circuit 2) according to the third embodiment described hereinabove provides substantially the same advantages as those of the real-time clock device 1 (the oscillation circuit 2) according to the first embodiment or the second embodiment.

Further, according to the real-time clock device 1 (the oscillation circuit 2) related to the third embodiment, it is possible to adjust the temperature range in which the frequency adjustment circuit 12 compensates the frequency-temperature characteristic of the resonator element 3 using the capacitance circuit 20, and the temperature range in which the frequency adjustment circuit 12 compensates the frequency-temperature characteristic of the resonator element 3 using only the logic circuit 30 depending on the intended use based on the temperature range adjustment data. For example, by narrowing the temperature range in which the compensation is performed using the capacitance circuit 20 (enlarging the temperature range in which the compensation is performed using only the logic circuit 30), it is possible to reduce the power consumption, and by enlarging the temperature range in which the compensation is performed using the capacitance circuit 20 (narrowing the temperature range in which the compensation is performed using only the logic circuit 30), it is possible to ensure the high frequency accuracy in a broader temperature range.

1-4. Fourth Embodiment

Figure 6:
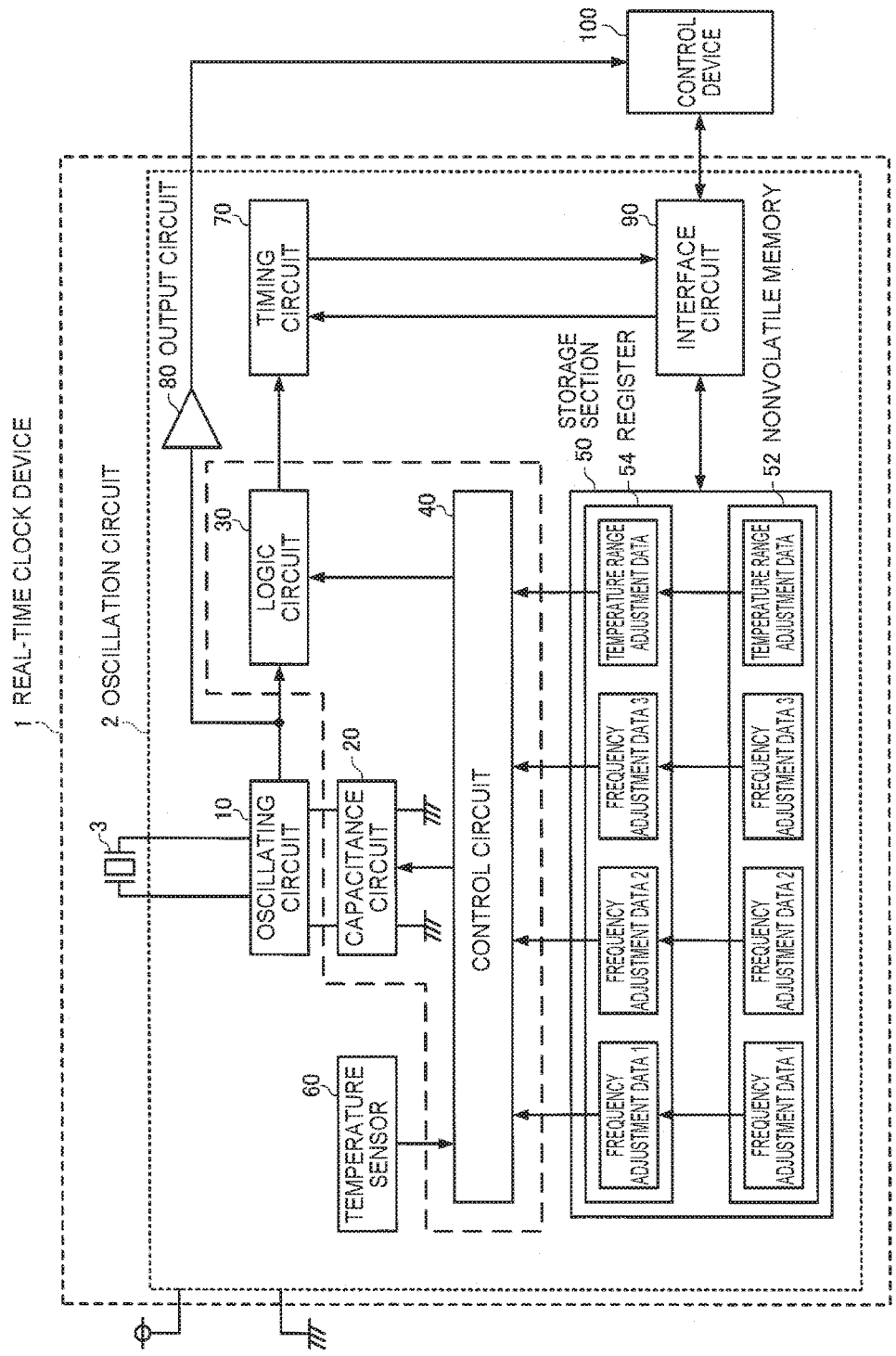
FIG. 6 is a functional block diagram of a real-time clock device according to a fourth embodiment of the invention.

FIG. 6 is a functional block diagram of a real-time clock device according to a fourth embodiment. In FIG. 6, the constituents substantially the same as those in FIG. 1 or FIG. 5 are denoted by the same reference symbols, and the fourth embodiment will hereinafter be described with a focus on different contents from the first embodiment, the second embodiment, and the third embodiment, and the description redundant to the first embodiment, the second embodiment, or the third embodiment will be omitted.

In the fourth embodiment, similarly to the first embodiment and the second embodiment, the control circuit 40 generates a control signal, with which the capacitance value (the load capacitance value of the oscillating circuit 10) of the capacitance circuit 20 becomes the capacitance value for correcting (compensating) the frequency-temperature characteristic of the resonator element 3, in accordance with the frequency adjustment data 1, and then outputs the control signal to the capacitance circuit 20 if the temperature corresponding to the output signal of the temperature sensor 60 is in the predetermined temperature range.

Further, the control circuit 40 controls the division ratio of the logic circuit 30 based on the frequency adjustment data 2 similarly to the first embodiment, or controls the division ratio of the logic circuit 30 based on the output signal of the temperature sensor 60 and the frequency adjustment data 2 similarly to the second embodiment.

Further, the control circuit 40 controls the predetermined temperature range based on the temperature range adjustment data similarly to the third embodiment.

Further, the control circuit 40 controls the division ratio of the logic circuit 30 based on frequency adjustment data 3 stored in the storage section 50 (the register 54). Specifically, the control circuit 40 generates a control signal (a correction signal) for the logic circuit 30 to correct the frequency variation other than the frequency-temperature characteristic of the resonator element 3 in accordance with the frequency adjustment data 2, and outputs the control signal to the logic circuit 30.

As described above, in the fourth embodiment, the frequency adjustment circuit 12 compensates the frequency-temperature characteristic of the resonator element 3 in the predetermined temperature range using the capacitance circuit 20 (or using both of the capacitance circuit 20 and the logic circuit 30), and compensates the frequency-temperature characteristic of the resonator element 3 outside the predetermined temperature range using only the logic circuit 30 due to the control by the control circuit 40, and the predetermined temperature range can be adjusted. Further, the frequency adjustment circuit 12 corrects the frequency variation other than the frequency-temperature characteristic of the resonator element 3 using the logic circuit 30.

The correction of the frequency variation other than the frequency-temperature characteristic of the resonator element 3 can also be the correction (aging correction) of a temporal frequency variation of the resonator element 3. The aging correction can also be, for example, the correction of the temporal variation of a deviation (an offset frequency) of the frequency of the signal output from the oscillating circuit 10 with respect to a desired frequency. It should be noted that the correction of the frequency variation other than the frequency-temperature characteristic of the resonator element 3 can also be the correction of an initial frequency deviation (a deviation from the desired frequency at the time of manufacturing the resonator element 3) of the resonator element 3.

As shown in FIG. 6, in the fourth embodiment, the nonvolatile memory 52 stores the frequency adjustment data 1, the frequency adjustment data 2, and the temperature range adjustment data similarly to the third embodiment.

Further, in the fourth embodiment, the nonvolatile memory 52 stores the frequency adjustment data 3 as the data for controlling the division ratio of the logic circuit 30. The frequency adjustment data 3 is the data for the correction of the frequency variation other than the frequency-temperature characteristic of the resonator element 3 by the logic circuit 30, and can also be, for example, data representing the offset frequency.

The frequency adjustment data 3 is determined based on the frequency of the oscillation signal output from the output circuit 80 in the state in which the real-time clock device 1 is set at a reference temperature (e.g., 25° C.) in, for example, the manufacturing process (the inspection process) of the real-time clock device 1, and is then written into the nonvolatile memory 52.

Similarly to the first embodiment, the second embodiment, or the third embodiment, the data (the frequency adjustment data 1, the frequency adjustment data 2, the frequency adjustment data 3, and the temperature range adjustment data) stored in the nonvolatile memory 52 are transferred from the nonvolatile memory 52 to the register 54 when powering on the real-time clock device 1 (the oscillation circuit 2), and are then held in the register 54.

Further, in the present embodiment, after the real-time clock device 1 starts the operation, the control device 100 measures the frequency of the oscillation signal output by the output circuit 80 at nonregular timings every several months through several years, for example, or with a regular period, to calculate the offset frequency. Alternatively, it is also possible for the control device 100 to calculate the elapsed time after manufacture based on the information such as date of manufacture of the real-time clock device 1, and then calculate the offset frequency in accordance with the elapsed time. On this occasion, it is also possible to store the information such as the date of manufacture of the real-time clock device 1 in the nonvolatile memory 52 of the real-time clock device 1 in, for example, the manufacturing process (the inspection process) of the real-time clock device 1 in advance, and then make the control device 100 retrieve the information such as the date of manufacture from the nonvolatile memory 52. Alternatively, it is also possible to store information of the serial number of the real-time clock device 1 in the nonvolatile memory 52 of the real-time clock device 1 in the manufacturing process (the inspection process) of the real-time clock device 1 in advance, and then make the control device 100 retrieve the information of the serial number from the nonvolatile memory 52 to identify the date of manufacture using a correspondence table between the serial number of the real-time clock device 1 and the date of manufacture.

Then, the control device 100 writes the information of the offset frequency calculated in the register 54 (the control device 100 can also write the information into the nonvolatile memory 52) as the frequency adjustment data 3 via the interface circuit 90.

The rest of the configuration and the function of the real-time clock device 1 (the oscillation circuit 2) according to the fourth embodiment are substantially the same as those of the first embodiment, the second embodiment, or the third embodiment.

Figure 7:
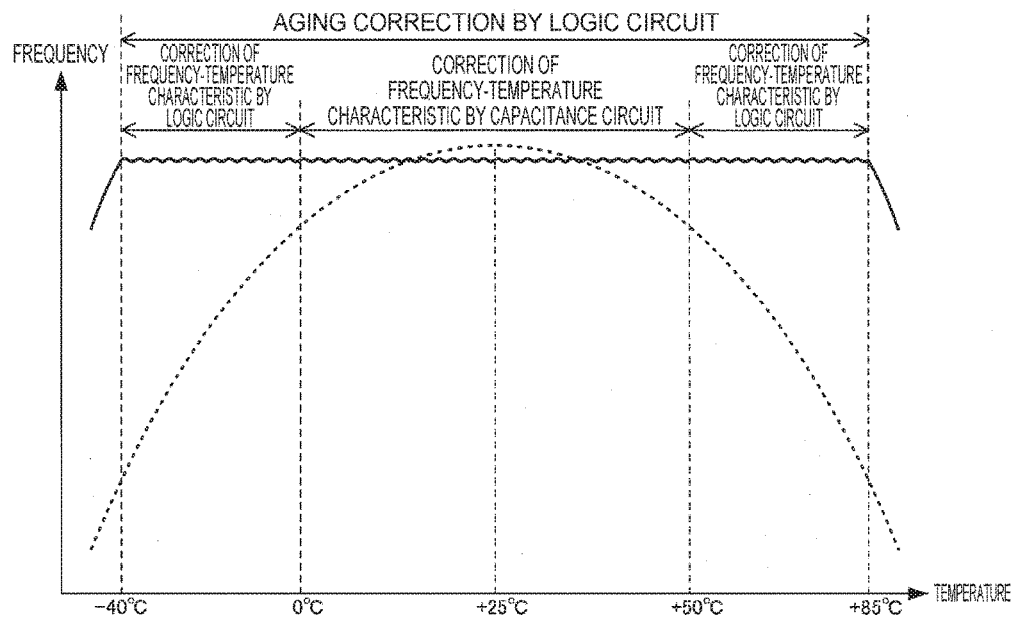
FIG. 7 is a diagram showing an example of a frequency correction method and a frequency-temperature characteristic of an output signal of a logic circuit in the fourth embodiment.
Figure 8:
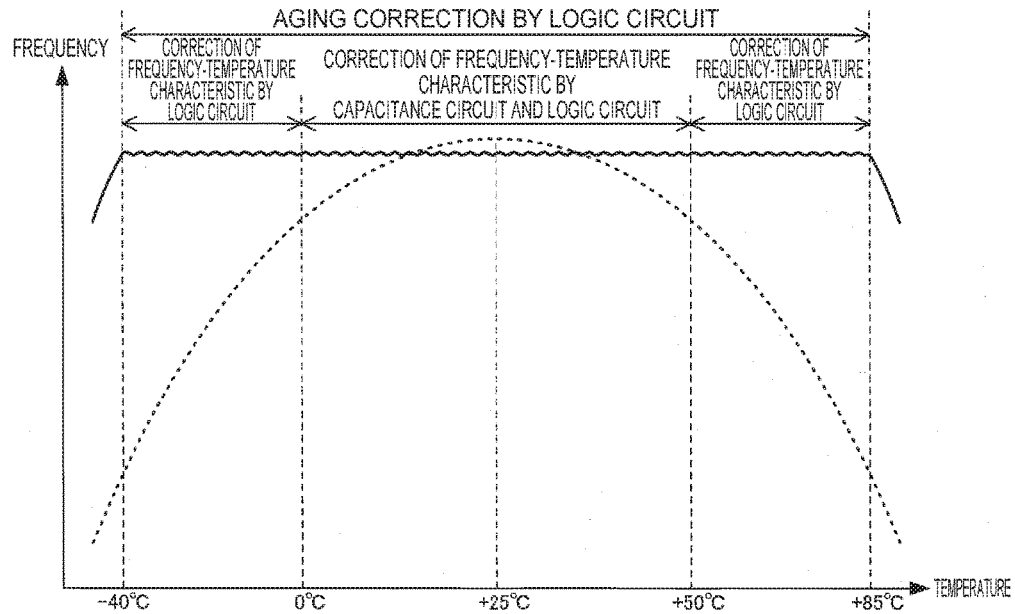
FIG. 8 is a diagram showing another example of the frequency correction method and the frequency-temperature characteristic of the output signal of the logic circuit in the fourth embodiment.

In the real-time clock device 1 (the oscillation circuit 2) according to the fourth embodiment described hereinabove, if the frequency adjustment circuit 12 does not correct the frequency-temperature characteristic of the resonator element 3 with the capacitance circuit 20 and the logic circuit 30 in the entire temperature range in the state in which considerable years have passed, the frequency-temperature characteristic of the output signal of the logic circuit 30 becomes the curve corresponding to the frequency-temperature characteristic of the resonator element 3 as indicated by the dotted line in FIG. 7 or FIG. 8, and the oscillation frequency at the reference temperature (e.g., 25° C.) deviates from the desired frequency (e.g., 1 Hz) due to the temporal variation.

In reality, due to the control by the control circuit 40, the frequency adjustment circuit 12 compensates the frequency-temperature characteristic of the resonator element using only the capacitance circuit 20 or both of the capacitance circuit 20 and the logic circuit 30 in the predetermined temperature range (e.g., not lower than 0° C. and not higher than +50° C.), and compensates the frequency-temperature characteristic of the resonator element 3 using only the logic circuit 30 outside the predetermined temperature range (e.g., not lower than −40° C. and lower than 0° C. or higher than +50° C. and not higher than +85° C.) in the entire temperature range (e.g., not lower than −40° C. and not higher than +85° C.) as the temperature range in which the operation of the oscillation circuit 2 is guaranteed. Further, the frequency adjustment circuit 12 corrects the frequency variation other than the frequency-temperature characteristic of the resonator element 3 using the logic circuit 30 in the entire temperature range due to the control by the control circuit 40. Therefore, as indicated by the solid line in FIG. 7 or FIG. 8, the frequency of the output signal of the logic circuit 30 is corrected so as to approximate to the desired frequency (e.g., 1 Hz) irrespective of the temperature and the elapsed time in the entire temperature range (e.g., not lower than −40° C. and not higher than +85° C.)

The real-time clock device 1 (the oscillation circuit 2) according to the fourth embodiment provides substantially the same advantages as those of the real-time clock device 1 (the oscillation circuit 2) according to the first embodiment, the second embodiment, or the third embodiment.

1-5. Modified Examples

In each of the embodiments described above, by the logic circuit 30 performing the frequency division with a period a half of the period of the output signal of the oscillating circuit 10 in sync with the both edges (the rising edge and the falling edge) of the output signal of the oscillating circuit 10, the correction accuracy by the logic circuit 30 can be doubled. For example, it is possible for the logic circuit 30 to include a circuit for generating an exclusive OR (EXOR) signal of the output signal of the oscillating circuit 10 and a signal obtained by delaying the output signal of the oscillating circuit 10 as much as roughly ¼ period, and a frequency divider circuit using the exclusive OR (EXOR) signal as the clock signal for the frequency divider circuit, and varying the division ratio in accordance with the control signal from the control circuit 40. Further, for example, the logic circuit 30 can include a circuit for generating a polarity inversion signal of the output signal of the oscillating circuit 10, a frequency divider circuit with a fixed division ratio, and a circuit for thinning some clock pulses from one of the output signal of the oscillating circuit 10 and the polarity inversion signal in accordance with the control signal from the control circuit 40, and at the same time generating the clock signal while switching to the other of the output signal of the oscillating circuit 10 and the polarity inversion signal, and then supplying the frequency divider circuit with the clock signal.

Further, although in each of the embodiments described above, the oscillation circuit 2 has the capacitance circuit 20 for correcting the frequency-temperature characteristic of the resonator element 3, the capacitance circuit 20 can be eliminated, and it is also possible to correct the frequency-temperature characteristic of the resonator element 3 only with the logic circuit 30.

Further, although in each of the embodiments described above, the real-time clock device 1 (the oscillation circuit 2) has the temperature sensor 60, the temperature sensor 60 can be eliminated. It is possible that, for example, the control device 100 measures the temperature, and then writes the temperature information thus measured to the register 54 via the interface circuit 90, and then the control circuit 40 retrieves the temperature information from the register 54 to control the correction of the frequency-temperature characteristic of the resonator element 3.

Further, although in the fourth embodiment described above, the aging correction by the frequency adjustment circuit 12 is enabled by updating the frequency adjustment data 3 based on the offset frequency obtained by the control device 100 measuring the oscillation frequency, it is also possible to arrange that the frequency adjustment circuit 12 automatically performs the aging correction without the intervention of the control device 100.

For example, the time information (e.g., the information of the date of manufacture of the real-time clock device 1) related to the reference time (the zero point) for calculating the elapsed time is stored in advance in the storage section 50 (the nonvolatile memory 52) in the manufacturing process (the inspection process) of the real-time clock device 1.

When the real-time clock device 1 starts the operation, the control circuit 40 obtains the clock time information (current time) generated by the timing circuit 70 at nonregular timing or at regular intervals to calculate the elapsed time from the reference time (e.g., the date of manufacture) based on the time information, which has been transferred from the nonvolatile memory 52 and then held in the register 54. Then, the control circuit 40 calculates the current offset frequency based on the elapsed time thus calculated, and then updates the frequency adjustment data 3 held in the register 54 in accordance with the offset frequency thus calculated (the frequency adjustment data 3 stored in the nonvolatile memory 52 can also be updated). Then, the control circuit 40 generates the control signal (the correction signal) based on the frequency adjustment data 3 thus updated to make the logic circuit 30 perform the aging correction. If it is known that the frequency of the resonator element 3 tends to increase due to the factor such as a gas emitted from a bonding member over time, or a change in internal stress of the bonding member, the excitation electrodes, and so on with passage of time, it is sufficient for the control circuit 40 to calculate the offset frequency so that the longer the elapsed time calculated is, the higher the offset frequency is. It should be noted that since the frequency variation of the resonator element 3 with passage of time described above varies by the materials of the excitation electrodes, the package for encapsulating the resonator element 3, and the bonding member, the manufacturing method, and so on, it is also possible to make the control circuit 40 capable of calculating a variety of types of offset frequencies with the elapsed time calculated. For example, it is also possible to make the control circuit 40 calculate the offset frequency so that the longer the elapsed time calculated is, the lower the offset frequency is, the offset frequency can be a positive value or a negative value, the sign of the offset frequency can be changed from positive to negative or from negative to positive with the elapsed time calculated, and the sign of the offset frequency can be changed two or more times.

Further, for example, the time information (e.g., the information of the date of manufacture of the real-time clock device 1) described above and temporal variation correcting information (e.g., a calculating formula or tabular information) for calculating the temporal frequency variation are stored in advance in the storage section 50 (the nonvolatile memory 52) in the manufacturing process (the inspection process) of the real-time clock device 1. It is also possible to generate the calculating formula or the tabular information of the temporal frequency variation by, for example, averaging the information obtained from a long-term storage test on a plurality of samples of the real-time clock device 1 to set the calculating formula or the tabular information as the temporal variation correcting information.

When the real-time clock device 1 starts the operation, the control circuit 40 obtains the clock time information (current time) generated by the timing circuit 70 at nonregular timing or at regular intervals to calculate the elapsed time from the reference time (e.g., the date of manufacture) based on the time information, which has been transferred from the nonvolatile memory 52 and then held in the register 54. Then, the control circuit 40 calculates the temporal frequency variation based on the elapsed time thus calculated and the temporal variation correcting information having been transferred from the nonvolatile memory 52 and held in the register 54, and then updates the frequency adjustment data 3 held in the register 54 in accordance with the frequency variation thus calculated (the frequency adjustment data 3 stored in the nonvolatile memory 52 can also be updated). Then, the control circuit 40 generates the control signal (the correction signal) based on the frequency adjustment data 3 thus updated to make the logic circuit 30 perform the aging correction.

2. Electronic Apparatus

Figure 9:
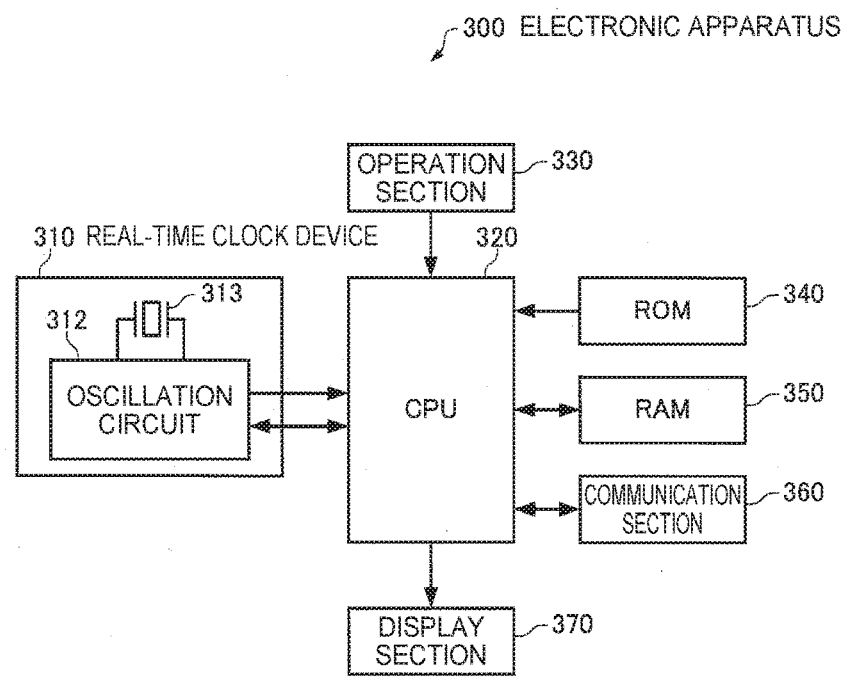
FIG. 9 is a functional block diagram showing an example of a configuration of an electronic apparatus according to an embodiment of the invention.
Figure 10:
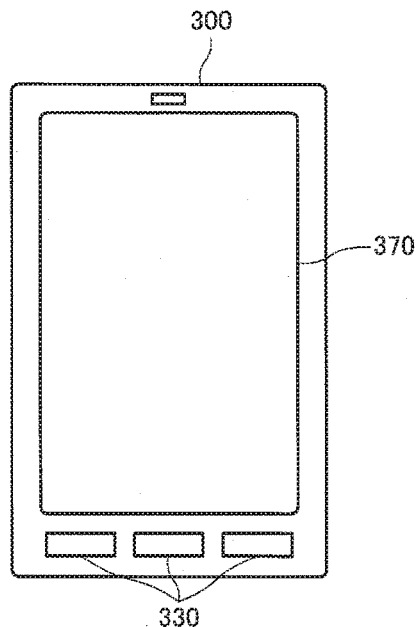
FIG. 10 is a diagram showing an example of an appearance of the electronic apparatus according to the embodiment.

FIG. 9 is a functional block diagram showing an example of a configuration of an electronic apparatus according to the embodiment of the invention. Further, FIG. 10 is a diagram showing an example of the appearance of a smartphone as an example of the electronic apparatus according to the present embodiment.

The electronic apparatus 300 according to the present embodiment is configured including a real-time clock device 310, a central processing unit (CPU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 9, or adding another constituent thereto.

The real-time clock device 310 is provided with an oscillation circuit 312 and a resonator element 313. The oscillation circuit 312 oscillates the resonator element 313 to generate an oscillation signal, and generates the clock time information based on the oscillation signal. The real-time clock device 310 (the oscillation circuit 312) outputs the oscillation signal thus generated to the CPU 320.

The CPU 320 performs a variety of types of arithmetic processing and control processing using the oscillation signal input from the real-time clock device 310 as a clock signal in accordance with the program stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, and so on. Further, the CPU 320 retrieves the clock time information from the real-time clock device 310 to perform the variety of types of arithmetic processing and control processing.

The operation section 330 is an input device including operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the programs and the data retrieved from the ROM 340, the data input from the operation section 330, and the calculation result obtained by the CPU 320 performing operations in accordance with the variety of types of programs.

The communication section 360 performs a variety of types of control processing for achieving the data communication between the CPU 320 and external devices.

The display section 370 is a display device formed of a liquid crystal display (LCD) or the like, and displays a variety of types of information based on the display signal input from the CPU 320. The display section 370 can also be provided with a touch panel, which functions as the operation section 330.

It should be noted that the electronic apparatus 300 can be provided with a configuration in which the real-time clock device 310 is replaced with an oscillator including the oscillation circuit 312 not provided with the timing function, and the resonator element 313.

By applying, for example, the oscillation circuit 2 (the timing circuit 70 can be eliminated) according to any one of the embodiments described above as the oscillation circuit 312, or by applying, for example, the real-time clock device 1 according to any one of the embodiments described above as the real-time clock device 310, it is possible to realize the electronic apparatus low in power consumption and high in reliability.

As such an electronic apparatus 300, a variety of electronic apparatuses can be adopted, and there can be cited, for example, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a mobile terminal base station apparatus, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments such as a gas meter, a water meter, an electricity meter (a smart meter) each provided with a wired or wireless communication function, and capable of transmitting a variety of data, gauges (e.g., gauges for cars, aircrafts, and boats and ships), a flight simulator, a head-mount display, a motion tracer, a motion tracker, a motion controller, and a pedestrian dead reckoning (PDR) system.

3. Moving Object

Figure 11:
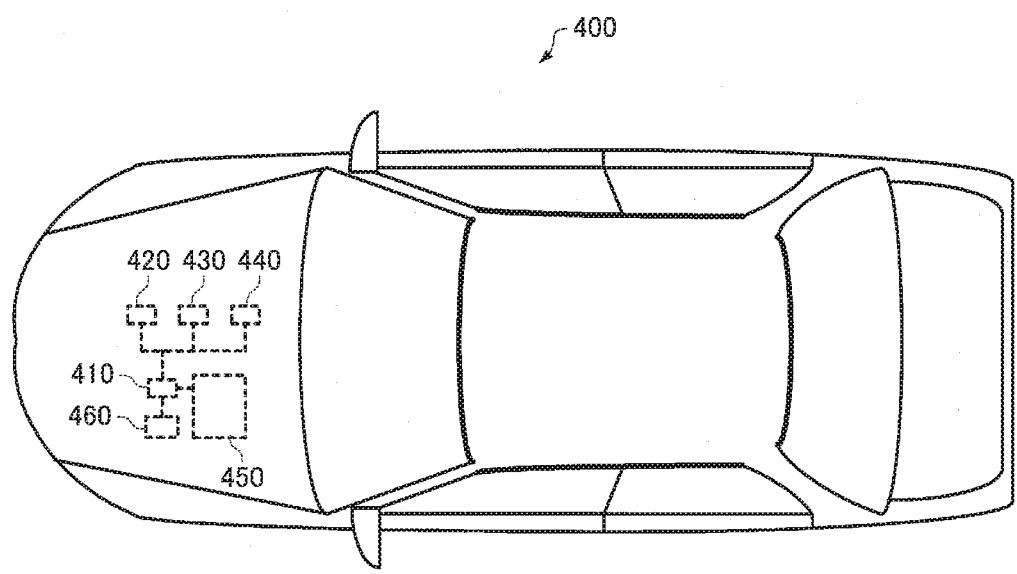
FIG. 11 is a diagram showing an example of a moving object according to an embodiment of the invention.

FIG. 11 is a diagram (a top view) showing an example of a moving object according to the present embodiment. The moving object 400 shown in FIG. 11 is configured including a real-time clock device 410, controllers 420, 430, and 440 for performing a variety of types of control such as an engine system, a brake system, and a keyless entry system, a battery 450, and a backup battery 460. It should be noted that the moving object according to the present embodiment can have a configuration obtained by eliminating some of the constituents (sections) shown in FIG. 11, or adding other constituents thereto.

The real-time clock device 410 is provided with an oscillation circuit and a resonator element not shown, and the oscillation circuit oscillates the resonator element to generate an oscillation signal, and generates the clock time information based on the oscillation signal. The oscillation signal is output from the external terminal of the real-time clock device 410 to the controllers 420, 430, and 440, and is used as, for example, a clock signal.

The battery 450 supplies the real-time clock device 410 and the controllers 420, 430, and 440 with electrical power. The backup battery 460 supplies the real-time clock device 410 and the controllers 420, 430, and 440 with electrical power when the output voltage of the battery 450 drops to a level lower than a threshold value.

It should be noted that the moving object 400 can be provided with a configuration in which the real-time clock device 410 is replaced with an oscillator including the oscillation circuit not provided with the timing function, and the resonator element.

By applying, for example, the oscillation circuit 2 (the timing circuit 70 can be eliminated) according to any one of the embodiments described above as the oscillation circuit provided to the real-time clock device 410 (or the oscillator), or by applying, for example, the real-time clock device 1 according to any one of the embodiments described above as the real-time clock device 410, it is possible to realize the moving object low in power consumption and high in reliability.

As such a moving object 400, there can be adopted a variety of types of moving objects, and there can be cited a vehicle (including an electric vehicle), an aircraft such as a jet plane or a helicopter, a ship, a boat, a rocket, an artificial satellite, and so on.

The invention is not limited to the embodiments described above, but can be implemented with a variety of modifications within the scope or the spirit of the invention.

The embodiments and the modified examples described above are illustrative only, and the invention is not limited to the embodiments and the modified examples. For example, it is also possible to arbitrarily combine any of the embodiments and the modified examples described above with each other.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations providing the same functions and advantages and configurations capable of achieving the same object as the configuration described as the embodiment of the invention. Further, the invention includes configurations obtained by adding known technologies to the configuration described as one of the embodiments of the invention.

The entire disclosure of Japanese Patent Application No. 2015-168816, filed Aug. 28, 2015 is expressly incorporated by reference herein.

What is claimed is:
1. An oscillation circuit comprising:
an oscillating circuit adapted to oscillate a resonator element having a frequency-temperature characteristic; and
a frequency adjustment circuit having a capacitance circuit connected to the oscillating circuit and adapted to adjust an oscillation frequency of the oscillating circuit, and a logic circuit, to which a signal having been output from the oscillating circuit is input, and which adjusts a frequency of the signal, wherein:

the frequency adjustment circuit is configured to compensate the frequency-temperature characteristic using at least the capacitance circuit in a first predetermined temperature range, the frequency adjustment circuit is configured to compensate the frequency-temperature characteristic using the logic circuit alone outside the first predetermined temperature range, a minimum limit of the first predetermined temperature range is adjustable, and a maximum limit of the first predetermined temperature range is adjustable.

2. The oscillation circuit according to claim 1, wherein the frequency adjustment circuit compensates the frequency-temperature characteristic using the capacitance circuit and the logic circuit in the first predetermined temperature range.

3. The oscillation circuit according to claim 1, wherein the frequency-temperature characteristic has a characteristic of a quadratic function with respect to a temperature of the resonator element; and the first predetermined temperature range includes a temperature corresponding to a peak of the quadratic function.

4. The oscillation circuit according to claim 2, wherein the frequency-temperature characteristic has a characteristic of a quadratic function with respect to a temperature of the resonator element; and the first predetermined temperature range includes a temperature corresponding to a peak of the quadratic function.

5. The oscillation circuit according to claim 1, wherein the frequency adjustment circuit corrects a frequency variation other than the frequency-temperature characteristic using the logic circuit.

6. The oscillation circuit according to claim 2, wherein the frequency adjustment circuit corrects a frequency variation other than the frequency-temperature characteristic using the logic circuit.

7. The oscillation circuit according to claim 3, wherein the frequency adjustment circuit corrects a frequency variation other than the frequency-temperature characteristic using the logic circuit.

8. The oscillation circuit according to claim 4, wherein the frequency adjustment circuit corrects a frequency variation other than the frequency-temperature characteristic using the logic circuit.

9. The oscillation circuit according to claim 5, wherein the frequency variation other than the frequency-temperature characteristic is a temporal frequency variation of the resonator element.

10. An electronic apparatus comprising:
the oscillation circuit according to claim 1.

11. A moving object comprising:
the oscillation circuit according to claim 1.

12. The oscillation circuit according to claim 1, wherein:
the first predetermined temperature range is adjustable to a second predetermined temperature range;
the minimum limit of the second predetermined temperature range is greater than the minimum limit of the first predetermined temperature range; and
the maximum limit of the second predetermined temperature range is less than the maximum limit of the first predetermined temperature range.

13. The oscillation circuit according to claim 1, wherein:
the first predetermined temperature range is adjustable to a second predetermined temperature range;
the minimum limit of the second predetermined temperature range is less than the minimum limit of the first predetermined temperature range; and
the maximum limit of the second predetermined temperature range is greater than the maximum limit of the first predetermined temperature range.

14. An oscillation circuit comprising:
an oscillating circuit adapted to oscillate a resonator element having a frequency-temperature characteristic; and
a frequency adjustment circuit having a capacitance circuit connected to the oscillating circuit and adapted to adjust an oscillation frequency of the oscillating circuit, and a logic circuit, to which a signal having been output from the oscillating circuit is input, and which adjusts a frequency of the signal, wherein:
the frequency adjustment circuit is configured to compensate the frequency-temperature characteristic using the capacitance circuit in a first predetermined temperature range,
the frequency adjustment circuit is configured to compensate the frequency-temperature characteristic using the logic circuit in a second predetermined temperature range, and
the second predetermined temperature range is different from the first predetermined temperature range.

* * * * *